(12) United States Patent
Wang et al.

(10) Patent No.: US 7,114,023 B2
(45) Date of Patent: Sep. 26, 2006

(54) NON-SEQUENTIAL ACCESS PATTERN BASED ADDRESS GENERATOR

(75) Inventors: Wen-Shan Wang, Chandler, AZ (US); Kalpesh D. Mehta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 502 days.

(21) Appl. No.: 10/651,379

(22) Filed: Aug. 29, 2003

(65) Prior Publication Data

US 2005/0102587 A1 May 12, 2005

(51) Int. Cl.
*G11C 8/04* (2006.01)

(52) U.S. Cl. .......................................... 711/1; 345/572

(58) Field of Classification Search ................ 345/572; 711/1; G11C 8/04
See application file for complete search history.

(56) References Cited

U.S. PATENT DOCUMENTS

| | | | |
|---|---|---|---|
| 5,109,488 A | 4/1992 | Dijkstra et al. | |
| 5,355,462 A | 10/1994 | Rousseau et al. | |
| 5,918,253 A | 6/1999 | Kadowaki | |
| 5,940,863 A | 8/1999 | Fimoff et al. | |
| 6,035,313 A | 3/2000 | Marchant | |
| 6,038,692 A * | 3/2000 | Shim | 714/765 |
| 6,138,262 A | 10/2000 | Baek | |
| 6,298,429 B1 | 10/2001 | Scott et al. | |
| 6,438,675 B1 * | 8/2002 | Root et al. | 711/217 |
| 6,442,622 B1 * | 8/2002 | Yamamoto et al. | 710/5 |

* cited by examiner

*Primary Examiner*—R. Stephen Dildine
(74) *Attorney, Agent, or Firm*—Schwabe Williamson & Wyatt

(57) ABSTRACT

An address generator is provided with an input to receive a base address for an array of storage locations, an offset generator to generate a number of offsets, and a combiner coupled to the input and the offset generator to combine the base address with the offsets to generate a number of access addresses for accessing the array of storage locations in accordance with a deterministic access pattern having at least one non-sequential access. In various embodiments, the address generator is included in each of a number of signal processing units, which in turn are included in a digital media processor.

40 Claims, 7 Drawing Sheets

NON-SEQUENTIAL ACCESS PATTERN BASED ADDRESS GENERATOR

FIELD OF THE INVENTION

Embodiments of the present invention relate to the field of data processing. More specifically, embodiments of the present invention are related to a non-sequential access pattern based memory address generator.

BACKGROUND OF THE INVENTION

Numerous data processing applications require data to be accessed in a deterministic manner that includes at least one non-sequential access. For example, in a number of media applications, such as processing of video data, a block of video data often has to be accessed in what is known as a zig-zag pattern. See FIG. 1 wherein a block of 8×8 video pixels accessed in a zig-zag pattern is illustrated. Such accessing of memory locations are frequently performed when video data are processed in accordance with one of a number of the video processing standards, such as JPEG or MPEG, during e.g. the encoding process. [JPEG=Joint Photographic Experts Group; MPEG=Moving Pictures Expert Group.]

Typically in the prior art, accessing data in a non-sequential manner requires the employment of multiple address generators and multiple control registers. Often, a first address generator is employed to generate a first set of addresses to access a first collection of memory locations to retrieve the commands for driving a second address generator to generate a second set of addresses to access the ultimate data of interest in the desired deterministic non-sequential pattern. Moreover, at least a couple of control registers are required to stage the retrieved commands.

Thus, a more efficient technique requiring less hardware is desired.

BRIEF DESCRIPTION OF THE DRAWINGS

Embodiments of the present invention will be described by way of exemplary embodiments, but not limitations, illustrated in the accompanying drawings in which like references denote similar elements, and in which.

DETAILED DESCRIPTION OF EMBODIMENTS OF THE INVENTION

Embodiments of the present invention include but are not limited to, an address generator, a signal processing unit incorporated with the address generator, as well as integrated circuits, components and systems incorporated with such signal processing units.

In the following description, various aspects of embodiments of the present invention will be described. However, it will be apparent to those skilled in the art that the present invention may be practiced with only some or all aspects of embodiments of the present invention described. For purposes of explanation, specific numbers, materials and configurations are set forth in order to provide a thorough understanding of the present invention. However, it will be apparent to one skilled in the art that embodiments of the present invention may be practiced without the specific details. In other instances, well-known features are omitted or simplified in order not to obscure embodiments of the present invention.

Various operations will be described as multiple discrete steps in turn, in a manner that is most helpful in understanding the various embodiments of the present invention, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1:
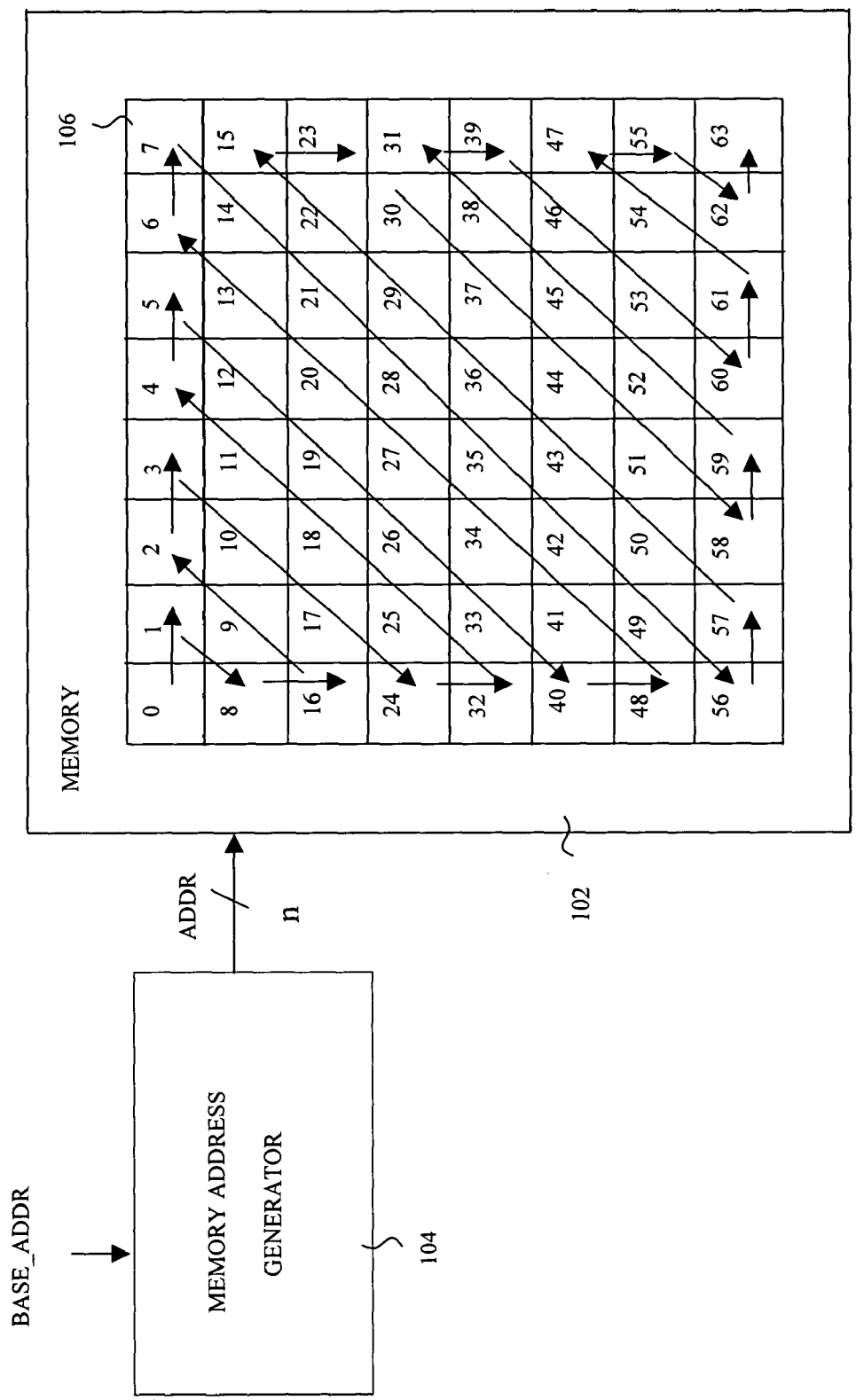
FIG. 1 illustrates an overview of the present invention, in accordance with one embodiment.

Referring now to FIG. 1 wherein an overview of the present invention, in accordance with one embodiment, is illustrated. As shown, for the embodiment, memory 102 is coupled to memory address generator 104 of the present invention. The term "memory" as used herein in the present application includes all forms of storage, including but are not limited to electronic, magnetic and optical storage. Also, for ease of understanding, memory 102 is illustrated as being coupled to memory address generator 104 without explicitly showing any intermediate component, e.g. a memory command handler. Embodiments of the present invention may be practiced with memory 102 being coupled to memory address generator 104 directly or indirectly through another component, such as a memory command handler.

Stored in memory 102 are data to be processed, including but are not limited to, media data. Media data include but are not limited to video data. Further, the stored data are to be accessed in logical units, also referred to as data units. For the purpose of this application, the two terms, logical unit and data unit, shall be used interchangeably. An example of such logical/data unit is a block of pixels of a picture/frame of a video, e.g. block 106, to be accessed in a deterministic manner that includes at least one non-sequential access. Specifically, for the illustrated example, block 106 comprises an array of 8×8 pixels, and is to be accessed (for processing) in the illustrated zig-zag manner. As will be readily apparent from the descriptions to follow, the data unit accessed may be of other sizes, such as 4×4, 8×4, 4×8, 16×16, and so forth.

To facilitate efficient performance of such deterministic non-sequential access, requiring less hardware, memory address generator 104 is advantageously incorporated with various teachings of the present invention to generate the required addresses to access each data unit in the desired zig-zag manner on its own, without the need of a complementary memory address generator.

In various embodiments, memory address generator 104 may be configurable to operate in a conventional sequential mode, and at least one non-sequential access pattern based mode of operation. In one embodiment, the at least one non-sequential access pattern based mode of operation includes but are not limited to the illustrated zig-zag pattern of access.

In various embodiments, whether operating in a conventional sequential mode or a non-sequential access pattern based mode of operation, memory address generator 104 generates the access addresses based at least in part on the base address (base_addr) of the data unit to be accessed. In other words, memory address generator 104 includes at least an input, through which base_addr may be provided to memory address generator 104.

For ease of understanding, but not limitation, the description to follow shall refer to the outermost rows and columns of an array of m×n data as the boundaries of the data unit. For example, for block 106, row data [0,1,2,3,4,5,6,7] shall be referred to as the "top" boundary, and row data [56, 57, 58, 59, 60, 61, 62, 63] shall be referred to as the "bottom" boundary. Columns data [0, 8, 16, 24, 32, 40, 48, 56] and [7, 15, 23, 31, 39, 47, 55, 63] shall be referred to as the "left" and "right" boundaries respectively.

Further, for the example zig-zag pattern of access, the access is said to have a current access direction. When moving from accessing pixel-1 to accessing pixel-8, or when moving from accessing pixel-10 to accessing pixel-17, and so forth of the data unit, the access is said to be having a SW current access direction. On the other hand, when moving from accessing pixel-9 to accessing pixel-2, or when moving from accessing pixel-25 to accessing pixel-18, and so forth of the data unit, the access is said to be having a NE current access direction.

Figure 2:
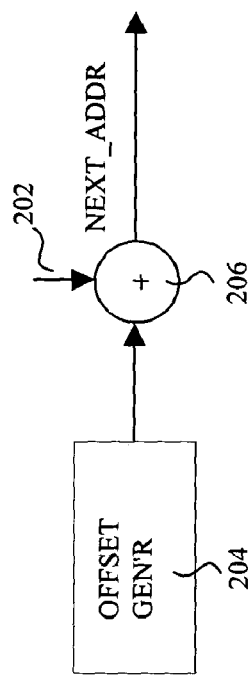
FIG. 2 illustrates the address generator of FIG. 1 in further detail, in accordance with one embodiment.

FIG. 2 illustrates memory address generator 104 in further details, in accordance with one embodiment. As illustrated, for the embodiment, memory address generator 104 may include input 202, offset generator 204 and combiner 206 coupled to each other as shown.

Input 202 may be employed to facilitate receipt of base_addr of the data unit to be accessed. Offset generator 204 may be employed to generate a number of offsets. Combiner 206, which for the embodiment, may be an adder, and may be employed to combine the generated offsets with base_addr to generate the access addresses to access the data unit in a desired deterministic manner (that includes at least one non-sequential access).

For the embodiment, the access addresses may be generated successively, by successively combining the offsets (which are also generated successively) with base_addr of the data unit to be accessed.

Figure 3:
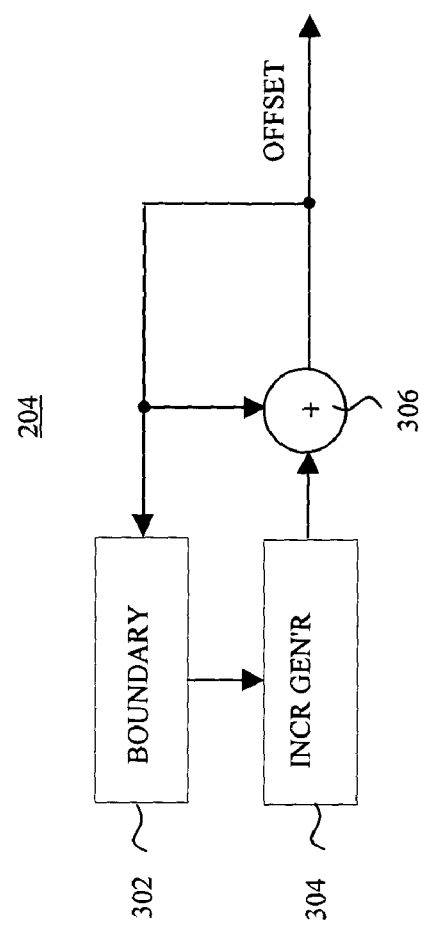
FIG. 3 illustrates the offset generator of FIG. 2 in further details, in accordance with one embodiment.

FIG. 3 illustrates offset generator 204 in further detail, in accordance with one embodiment. As illustrated, for the embodiment, offset generator 204 may include boundary detection unit 302, increment generator 304, and combiner 306 coupled to each other as shown.

Boundary detection unit 302 may be employed to determine whether a boundary data item of the data unit is being accessed. Increment generator 304 may be employed to generate increments for use to generate the offsets (for combination with base_addr to generate the access addresses). Combiner 306, which for the embodiment may be an adder, and may be employed to combine a prior offset, more specifically, for the embodiment, the immediately preceding offset, with a newly generated increment to generate the next offset.

In other words, for the embodiment, the increments may be successively generated, and successively combined with their respective immediately preceding offsets to successively generate the appropriate offsets (to facilitate successive generation of the desired access addresses).

Note that an increment of negative value may in substance be a decrement. Similarly, a decrement of negative value may in substance be an increment. Accordingly, for the purpose of this application, the two terms may be used interchangeably, as each may assume a negative value, unless the context clearly stated to the contrary.

Figure 4A:
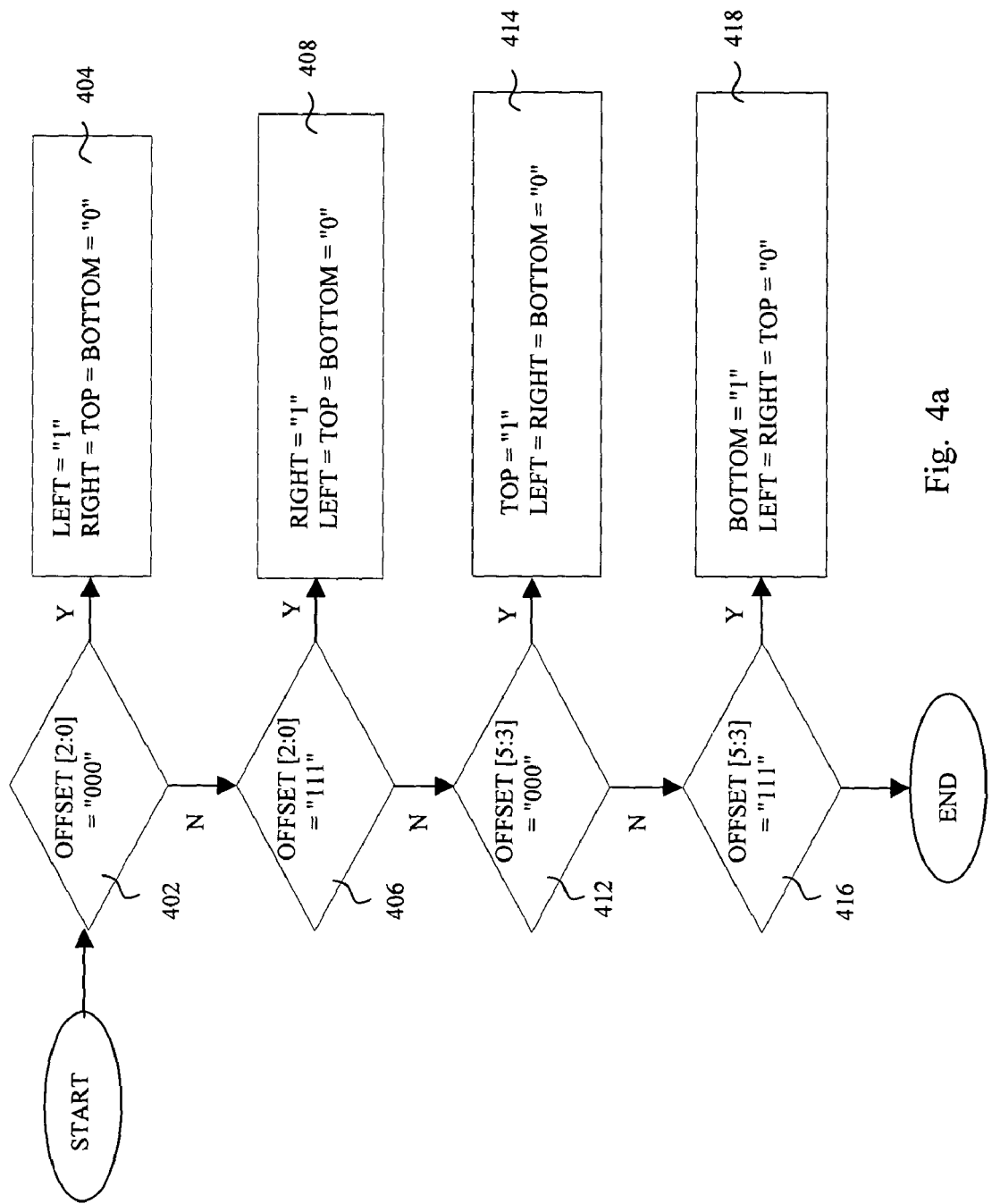
FIG. 4a illustrates the relevant operational logic of the boundary detection unit of FIG. 3, in accordance with one embodiment.

FIG. 4*a* illustrates the relevant operational logic of the boundary detection unit of FIG. 3, in accordance with one embodiment. As illustrated, for the embodiment, boundary detection unit 302 determines whether a data item located at a boundary of the data unit is being accessed, by analyzing a number of bits of the current offset. More specifically, for the embodiment, boundary detection unit 302 determines whether a data item located at a left boundary of the data unit or a right boundary of the data unit is being accessed, by analyzing the least significant bits of the current offset.

As shown, at block 402, boundary detection unit 302 determines whether a data item located at a left boundary of the data unit is being accessed, by analyzing whether the three least significant bits of the current offset (offset[2:0]) equal "000". If so, boundary detection unit 302 sets a "left boundary" signal to true ("1"), and a "right boundary" signal, a "top" "boundary" signal, and a "bottom boundary" signal to false ("0"), block 404.

At block 406, boundary detection unit 302 determines whether a data item located at a right boundary of the data unit is being accessed, by analyzing whether the three least significant bits of the current offset (offset[2:0]) equal "111". If so, boundary detection unit 302 sets a "right boundary" signal to true ("1"), and a "left boundary" signal, a "top" "boundary" signal, and a "bottom boundary" signal to false ("0"), block 408.

Further, for the embodiment, boundary detection unit 302 determines whether a data item located at a top boundary or a bottom boundary is being accessed, by analyzing a number of the intermediate bits, more specifically, bits[5:3], of the current offset.

As shown, at block 412, boundary detection unit 302 determines whether a data item located at a top boundary of the data unit is being accessed, by analyzing whether three intermediate bits of the current offset (offset[5:3]) equal "000". If so, boundary detection unit 302 sets a "top boundary" signal to true ("1"), and a "bottom boundary" signal, a "right boundary" signal, and a "left boundary" signal to false ("0"), block 414.

At block 416, boundary detection unit 302 determines whether a data item located at a bottom boundary of the data unit is being accessed, by analyzing whether three intermediate bits of the current offset (offset[5:3]) equal "111". If so, boundary detection unit 302 sets a "bottom boundary" signal to true ("1"), and a "top boundary" signal, a "left boundary" signal, and a "right boundary" signal to false ("0").

In various embodiments, the above described operational logic of boundary detection unit 302 may be implemented in firmware. In other embodiments, the above described operational logic of boundary detection unit 302 may be implemented via gates of Application Specification Integrated Circuits (ASIC), or reprogrammable logic of programmable logic devices (PLD), e.g. field programmable gate arrays (FPGA).

Figure 4B:
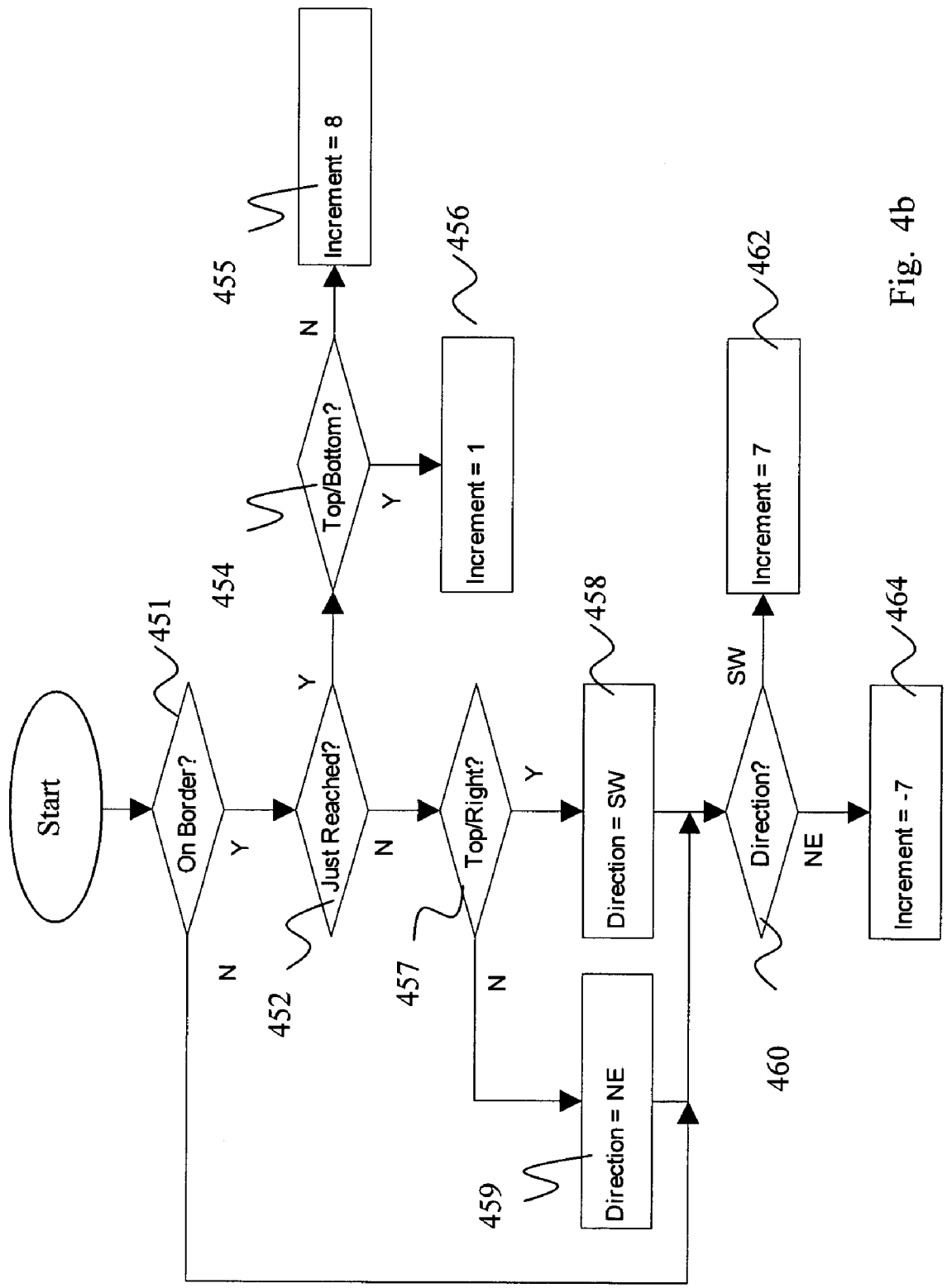
FIG. 4b illustrates the relevant operational logic of the increment generator of FIG. 3, in accordance with one embodiment.

FIG. 4b illustrates the relevant operational logic of increment generator 304 of FIG. 3 in accordance with one embodiment. For ease of understanding, the embodiment assumes the data unit being retrieved is a data unit comprising an array of 8×8 data items. However, it will be readily apparent that the present invention is not limited to only data units of such size. Embodiments of the present invention may be practiced for data units of other sizes, with the described embodiment being adjusted accordingly, which adjustments, based on the descriptions provided herein, are well within the ability of those ordinarily skilled in the art.

As illustrated, for the generation of each increment, increment generator 304 first determines if a data item (e.g. a pixel) disposed at a boundary is being accessed, block 451. If so, increment generator 304 further determines if the border was just reached, block 452. In various embodiments including the boundary detection unit 302 of FIG. 3, the determinations may be performed based on the indications outputted by boundary detection unit 302.

If so, increment generator 304 further determines whether it is the top or the bottom boundary of the data unit that was just reached, block 454. Similarly, in various embodiments including the boundary detection unit 302 of FIG. 3, the determination may be performed based on the indications outputted by boundary detection unit 302.

If it is determined that it is the top or the bottom boundary that was just reached, increment generator 304 generates an increment of "1", block 456.

If it is determined that it is not the top or the bottom boundary that was just reached, which implies that it is either the left or the right boundary that was just reached, increment generator 304 generates an increment of "8", block 455.

Back at block 452, if it was determined that a data item (e.g. a pixel) disposed at a boundary was not just reached, increment generator 304 further determines whether the access is at the top or the right boundary, block 457. If so, it sets the current direction to SW, block 458, otherwise, it sets the current direction to NE, block 459.

In various embodiments, increment generator 304 may employ a flag to track the current direction. On initialization, the flag is set to indicate "top boundary". Subsequently, it may be set to indicate the SW direction, the NE direction and so forth, as earlier described.

Upon setting the current direction at block 458/459 or on determining that the access is on at a location disposed on a boundary back at block 451, increment generator 304 further determines what the current direction of access is, block 460.

On determining that the current direction is SW, increment generator 304 generates an increment of "+7", block 462. However, if the current direction is NE, increment generator 304 generates an increment of "−7", block 464.

Accordingly, for the embodiment, the successive increments are generated.

Similar to boundary detection unit 302, in various embodiments, the above described operational logic of increment generator 304 may be implemented in firmware. In other embodiments, the above described operational logic of increment generator 304 may be implemented via gates of ASIC or reprogrammable logic of PLD, e.g. FPGA.

Figure 5:
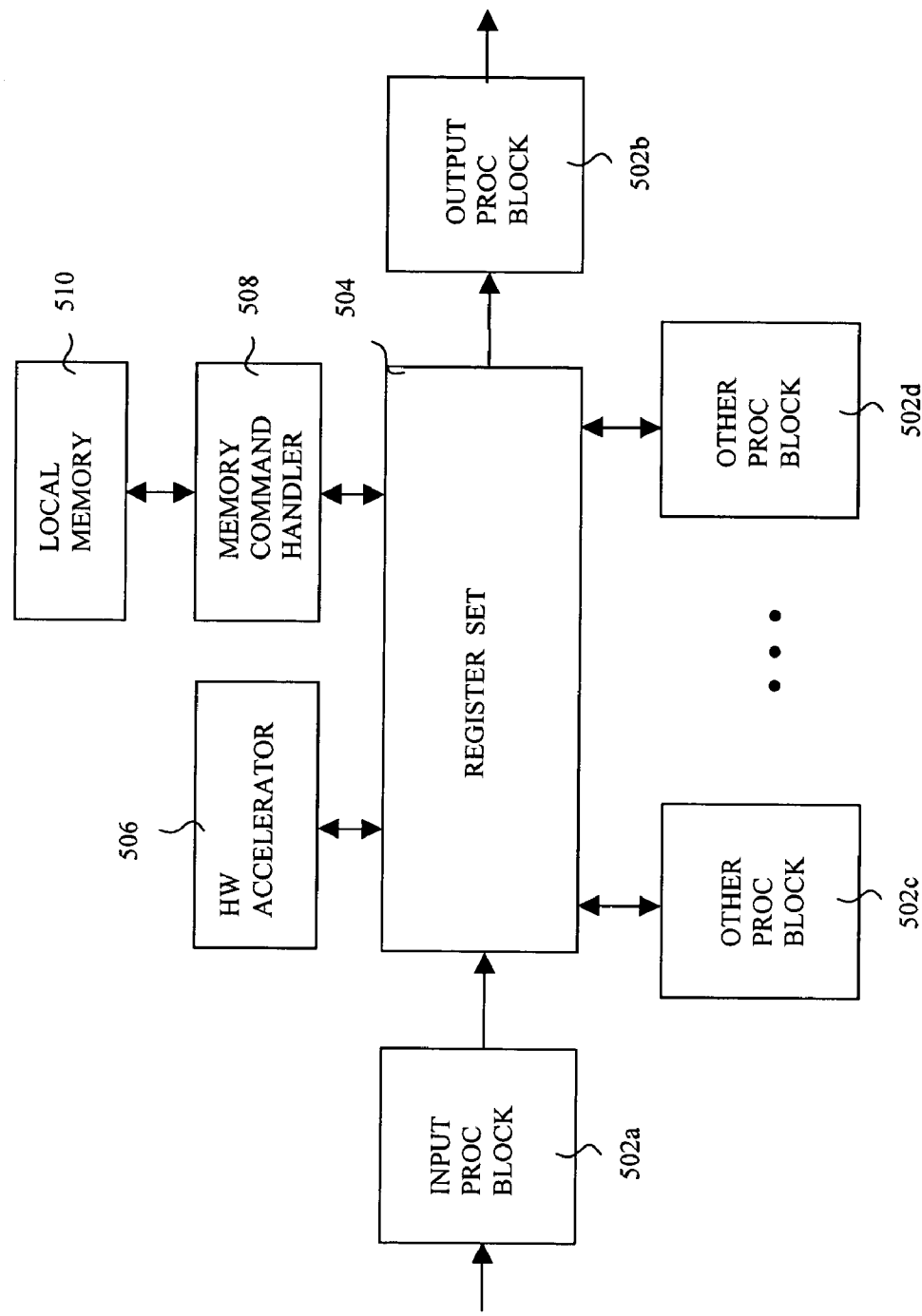
FIG. 5 illustrates a signal processing unit incorporated with the address generator of the present invention, in accordance with one example application of the present invention.

FIG. 5 illustrates a signal processing unit incorporated with the address generator of the present invention, in accordance with an example application of the present invention. As illustrated, signal processing unit 500 includes processing blocks 502a–502d, register set 504, hardware accelerator 506, memory command handler 508 and local memory 510, coupled to each other as shown.

For the embodiment, processing blocks 502a–502d are variants of a basic processing block, which is the subject matter of co-pending application number 10/651,381, entitled "Processing Block with Integrated Light-Weight Multi-Threading Support", contemporaneously filed. More specifically, processing blocks 502a–502b are input and output variants of the disclosed basic processing block respectively, i.e. the basic processing block with an input/output interface configured as an input interface in the former case, and as an output interface in the latter case. Processing blocks 502c–502d, on the other hand, are computational intensive variants of the basic processing block, i.e. with added multiplication and/or floating point processing support. For more information, see the co-pending application.

Register set 504 and local memory 510 may be any one of a number of registers and memory known in the art or to be designed. Hardware accelerator 506 implements one variant of the memory address generator of FIG. 2, equipped with the ability to generate access addresses to access a data unit in local memory 510 in accordance with a non-sequential access pattern. Memory command handler 508 may be any one of such elements known in the art or to be designed.

During operation, data to be processed are inputted in the signal processing block 500, more particularly, registers of register set 504 and/or local memory 510, through input processing block 502*a*. The inputted data, in turn, are processed by selected ones of processing blocks 502*a*–502*d*, with the processing results being placed back in the registers of register set 504 and/or local memory 510. The processing results, in due course, are outputted from the registers of register set 504 and/or local memory 510, through output processing block 502*b*. If needed, data units stored in local memory 510 are retrieved from local memory 510 in a non-sequential access manner, with the address generator of the present invention, implemented by hardware accelerator 506, generating the access addresses.

Figure 6:
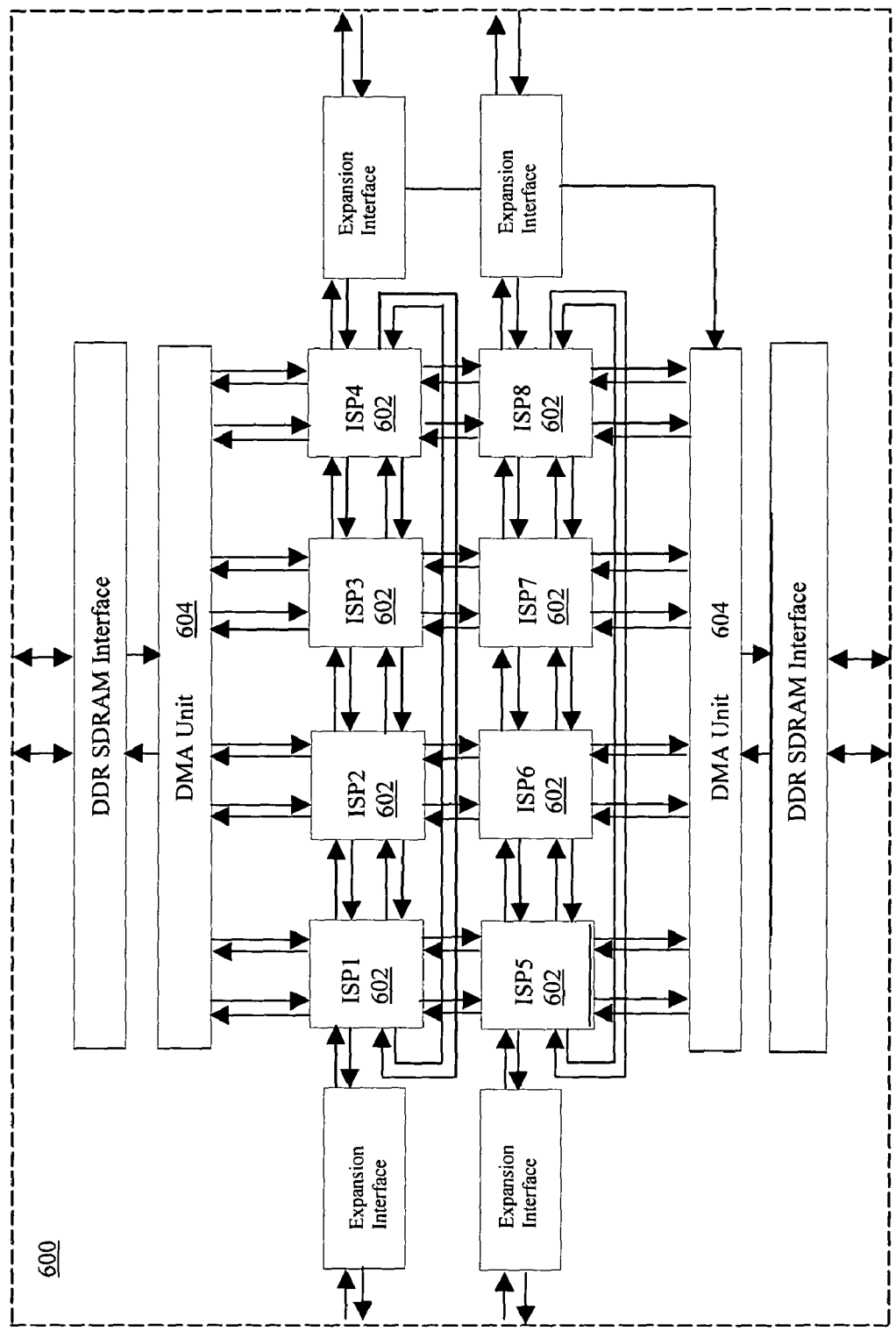
FIG. 6 illustrates a digital media processor incorporated with the signal processing unit of FIG. 5, in accordance with one example application of the present invention.

FIG. 6 illustrates a digital media processor incorporated with the signal processor of FIG. 5, in accordance with one embodiment. As illustrated, digital media processor 600 includes a number of signal processors (SP) 602, and a number of direct memory access (DMA) units 604, coupled to each other as shown.

SP 602 are equipped to cooperate with each other to process digital media data. DMA units 604 are equipped to retrieve the digital media data from external memory for SP 602.

For the embodiment, SP units 602 are equipped with the address generator of FIG. 2 to allow digital media data units to be retrieved from local memory for SP 602 in a more efficient non-sequential access pattern based manner, e.g. the zig-zag pattern illustrated in FIG. 1.

In one embodiment, the above described digital media processor 600 may be disposed in a single integrated circuit.

Figure 7:
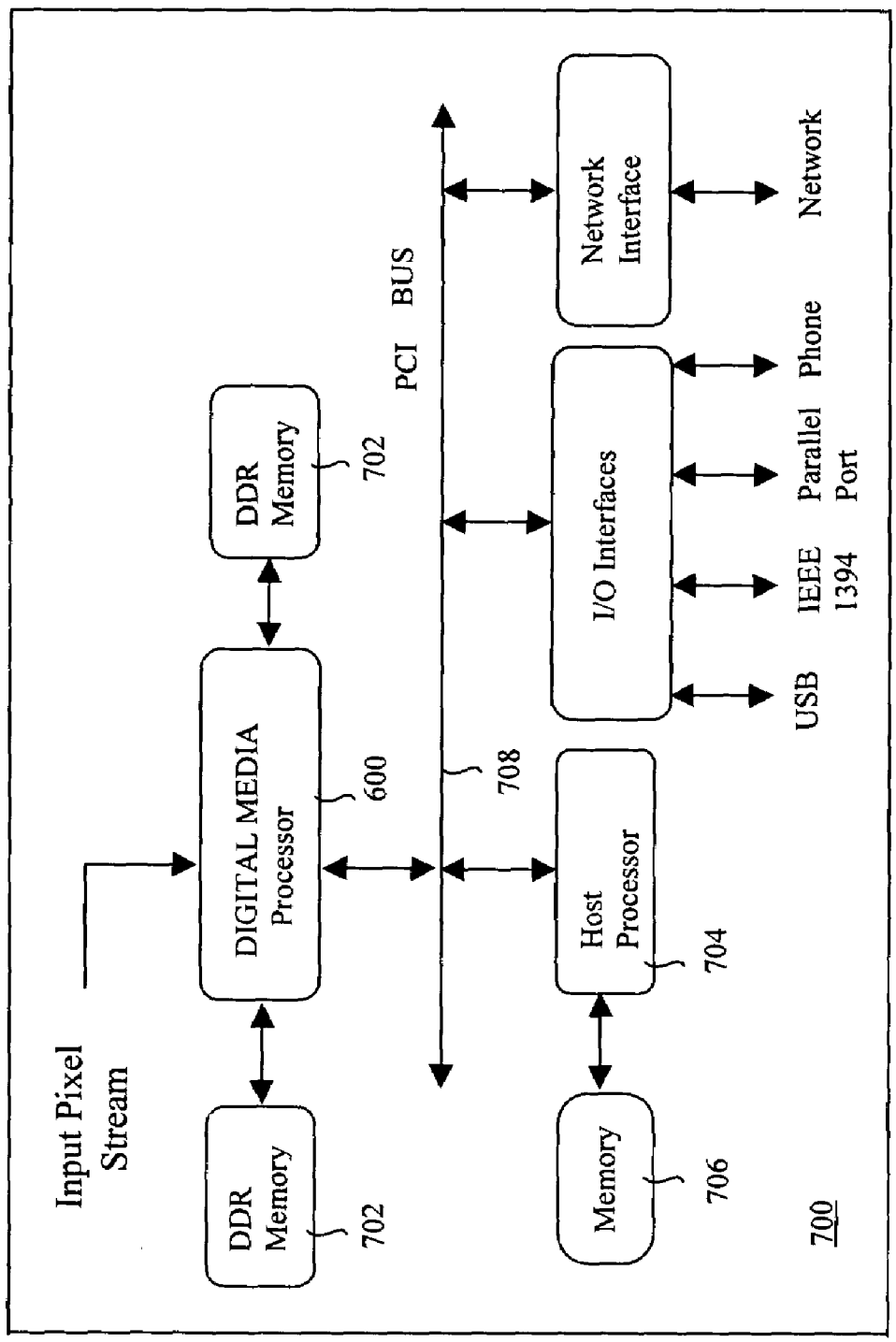
FIG. 7 illustrates a digital system incorporated with the digital media processor of FIG. 6, in accordance with one example application of the present invention.

FIG. 7 illustrates a digital system incorporated with the teachings of the present invention, in accordance with one embodiment. Digital system 700 includes digital media processor 600 of FIG. 6, DDR memory 702, host processor 704, memory 706 and bus 708 coupled to each other as shown.

In other words, digital media processor 600 is equipped with memory access units having address generators that are endowed with the ability to generate addresses to facilitate data units to be accessed in a non-sequential pattern based access manner, as described earlier.

Otherwise, DDR memory 702, memory 706, host processor 704 and bus 708 all represent a broad range of these items known in the art or to be designed.

In various embodiments, digital system 700 may be a server, a desktop computer, a laptop computer, a tablet computer, a pocket PC, a palm sized personal digital assistant, a wireless mobile phone, a set-top box, an entertainment control console, a digital camera, a digital camcorder, a video recorder, or a video player.

Thus, it can be seen from the above descriptions, a novel address generator and a number of its example applications have been described.

While embodiments of the present invention have been described in terms of the foregoing embodiments, those skilled in the art will recognize that the invention is not limited to the embodiments described. Embodiments of the present invention may be practiced with modification and alteration within the spirit and scope of the appended claims.

Thus, the description is to be regarded as illustrative instead of restrictive on the present invention.

What is claimed is:

1. An address generator comprising:
   an input to receive a base address for an array of storage locations;
   an offset generator to generate a plurality of offsets for generating a plurality of access addresses for accessing the storage locations in accordance with a deterministic non-sequential access pattern, the offset generator adapted to generate each offset based at least in part on whether the deterministic non-sequential access pattern has reach a boundary of the array of storage locations;
   a combiner coupled to the input and the offset generator to combine the base address with the plurality of offsets to generate a plurality of access addresses for accessing the array of storage locations in accordance with the deterministic non-sequential access pattern.

2. The address generator of claim 1, wherein
   the offset generator is designed to generate the offsets successively; and
   the combiner is complementarily designed to successively combine the based address with the successively generated offsets to successively generate the access addresses.

3. The address generator of claim 1, wherein the offset generator comprises
   a boundary detection unit to output an indicator indicating whether a boundary of the array of storage location has been reached;
   an increment generator coupled to the boundary detection unit to generate an increment based at least in part on the indicator outputted by the boundary detection unit; and
   a combiner coupled to the increment generator to combine the increment with a first offset to generate a second offset.

4. The address generator of claim 3, wherein the boundary detection unit is designed to output an indicator indicating whether a boundary of the array of storage locations has been reached based on a plurality of bits of a current offset.

5. The address generator of claim 4, wherein the boundary detection unit is designed to output an indicator indicating whether a selected one of a left boundary and a right boundary of the array of storage locations has been reached based at least in part on a plurality of least significant bits of the current offset.

6. The address generator of claim 4, wherein the boundary detection unit is designed to output an indicator indicating whether a selected one of a top boundary and a bottom boundary of the array of storage locations has been reached based at least in part on a plurality of intermediate bits of the current offset.

7. The address generator of claim 3, wherein the increment generator is designed to determine whether a boundary of the array of storage locations has just been reached.

8. The address generator of claim 7, wherein the increment generator is further designed to determine whether a selected one of a top boundary and a bottom boundary of the array of storage locations has just been reached, after determining that a boundary of the array of storage locations has just been reached.

9. The address generator of claim 8, wherein the increment generator is further designed to output an increment of 1 after determining that a selected one of a top boundary and a bottom boundary of the array of storage locations has just been reached.

10. The address generator of claim 7, wherein the increment generator is further designed to determine whether a selected one of a left boundary and a right boundary of the array of storage locations has just been reached, after determining that a boundary of the array of storage locations has just been reached.

11. The address generator of claim 10, wherein the increment generator is further designed to output an increment of 8 after determining that a selected one of a left boundary and a right boundary of the array of storage locations has just been reached.

12. The address generator of claim 7, wherein the increment generator is further designed to determine a current access direction after determining that a boundary of the array of storage locations has not been just reached.

13. The address generator of claim 12, wherein the increment generator is further designed to output an increment of +7 after determining a current access direction of a first kind.

14. The address generator of claim 12, wherein the increment generator is further designed to output an increment of −7 after determining a current access direction of a first kind.

15. The address generator of claim 1, wherein the array of storage locations comprise 8×8 storage locations.

16. The address generator of claim 1, wherein the deterministic non-sequential access pattern is a zig-zag pattern.

17. An address generation method, comprising:
receiving a base address of an array of storage locations;
generating a plurality of offsets for generating a plurality of access addresses for accessing the array of storage locations in accordance with a deterministic non-sequential access pattern, with the generating of each offset including determining whether the deterministic non-sequential access pattern has reached a boundary of the array of storage locations;
combining the base address with the plurality of offsets to generate a plurality of access addresses for accessing the array of storage locations in accordance with the deterministic non-sequential access pattern having at least one non-sequential access.

18. The address generation method of claim 17, wherein
said generating of offsets comprises successively generating the offsets; and
said combining comprises successively combine the based address with the successively generated offsets to successively generate the access addresses.

19. The address generation method of claim 17, wherein said generating of offsets comprises
detecting and indicating whether a boundary of the array of storage location has been reached;
generating an increment based at least in part on said detecting and indicating of whether a boundary of the array of storage locations has been reached; and
combining the increment with a first offset to generate a second offset.

20. The address generation method of claim 19, wherein said detecting and indicating comprises analyzing a plurality of bits of a current offset to determine whether a boundary of the array of storage locations has been reached.

21. The address generation method of claim 20, wherein said detecting and indicating comprises analyzing a plurality of least significant bits of the current offset to determine whether a selected one of a left boundary and a right boundary of the array of storage locations has been reached.

22. The address generation method of claim 19, wherein said detecting and indicating comprises analyzing a plurality of intermediate bits of the current offset to determine whether a selected one of a top boundary and a bottom boundary of the array of storage locations has been reached.

23. The address generation method of claim 19, wherein said generating of an increment comprises determining whether a boundary of the array of storage locations has just been reached.

24. The address generation method of claim 23, wherein said generating of an increment comprises determining whether a selected one of a top boundary and a bottom boundary of the array of storage locations has just been reached, after determining that a boundary of the array of storage locations has just been reached.

25. The address generation method of claim 24, wherein said generating of an increment comprises generating an increment of 1 after determining that a selected one of a top boundary and a bottom boundary of the array of storage locations has just been reached.

26. The address generation method of claim 23, wherein said generating of an increment comprises determining whether a selected one of a left boundary and a right boundary of the array of storage locations has just been reached, after determining that a boundary of the array of storage locations has just been reached.

27. The address generation of claim 26, wherein said generating of an increment comprises generating an increment of 8 after determining that a selected one of a left boundary and a right boundary of the array of storage locations has just been reached.

28. The address generation method of claim 23, wherein said generating of an increment comprises determining a current access direction after determining that a boundary of the array of storage locations has not been just reached.

29. The address generation method of claim 28, wherein said generating of an increment comprises generating an increment of +7 after determining a current access direction of a first kind.

30. The address generation of claim 28, wherein said generating of an increment comprises generating an increment of −7 after determining a current access direction of a first kind.

31. The address generation method of claim 17, wherein the array of storage locations comprise 8×8 storage locations.

32. The address generation method of claim 17, wherein the deterministic non-sequential access pattern is a zig-zag pattern.

33. A digital media processor comprising:
a direct memory access unit to access media data; and
a signal processing unit coupled to the direct memory access unit to process the accessed media data, including a local memory to store the media data while they are being processed, and an memory address generator to generate addresses to access the local memory, the memory address generator having
an input to receive a base address for an array of memory locations of a unit of the media data,
an offset generator to generate a plurality of offsets, and
a combiner coupled to the input and the offset generator to combine the base address with the plurality of offsets to generate a plurality of access addresses for accessing the array of memory locations in accordance with a deterministic access pattern having at least one non-sequential access.

34. The digital media processor of claim 33, wherein
the offset generator of the memory address generator is designed to generate the offsets successively; and the combiner of the memory address generator is complementarily designed to successively combine the based address with the successively generated offsets to successively generate the access addresses.

35. The digital media processor of claim 33, wherein the offset generator of the memory address generator comprises
 a boundary detection unit to output an indicator indicating whether a boundary of the array of memory locations has been reached;
 an increment generator coupled to the boundary detection unit to generate an increment based at least in part on the indicator outputted by the boundary detection unit; and
 a combiner coupled to the increment generator to combine the increment with a first offset to generate a second offset.

36. The digital media processor of claim 33, wherein the deterministic access pattern is a zig-zag pattern.

37. A digital system comprising:
 a host processor;
 first memory coupled to the host processor;
 second memory;
 a digital media processor coupled to the second memory and the host processor, the digital media processor having at least one signal processing unit equipped with an address generator that includes
 an input to receive a base address for an array of memory locations of a unit of media data,
 an offset generator to generate a plurality of offsets, and
 a combiner coupled to the input and the offset generator to combine the base address with the plurality of offsets to generate a plurality of access addresses for accessing the array of memory locations in accordance with a deterministic access pattern having at least one non-sequential access.

38. The digital system of claim 37, wherein
 the offset generator is designed to generate the offsets successively; and
 the combiner is complementarily designed to successively combine the based address with the successively generated offsets to successively generate the access addresses.

39. The digital system of claim 37, wherein the offset generator comprises
 a boundary detection unit to output an indicator indicating whether a boundary of the array of memory locations has been reached;
 an increment generator coupled to the boundary detection unit to generate an increment based at least in part on the indicator outputted by the boundary detection unit; and
 a combiner coupled to the increment generator to combine the increment with a first offset to generate a second offset.

40. The digital system of claim 37, wherein the digital system is a selected one of a server, a palm sized personal digital assistant, a wireless mobile phone, a set-top box, an entertainment control console, a digital camera, a digital camcorder, a video recorder, or a video player.

\* \* \* \* \*

UNITED STATES PATENT AND TRADEMARK OFFICE
CERTIFICATE OF CORRECTION

PATENT NO. : 7,114,023 B2
APPLICATION NO. : 10/651379
DATED : September 26, 2006
INVENTOR(S) : Wen-Shan Wang et al.

Page 1 of 1

It is certified that error appears in the above-identified patent and that said Letters Patent is hereby corrected as shown below:

Column 8

Line 11, "... has reach a ..." should read --... has reached a ...--.

Column 10

Line 24, "The address generation of ..." should read --The address generation method of ...--.

Line 37, "The address generation of ..." should read --The address generation method of ...--.

Signed and Sealed this

Twenty-second Day of December, 2009

David J. Kappos
*Director of the United States Patent and Trademark Office*